United States Patent [19]

Nelson et al.

[11] 4,278,965
[45] Jul. 14, 1981

[54] PHOTO-OPTICAL KEYBOARD HAVING N-KEY ROLLOVER

[75] Inventors: Edward I. Nelson, Sunrise; Harry B. Mueller, Hollywood Hills; John E. Lane, Pompano, all of Fla.

[73] Assignee: Burroughs Corporation, Detroit, Mich.

[21] Appl. No.: 75,396

[22] Filed: Sep. 14, 1979

[51] Int. Cl.$^3$ .............................................. G06F 3/02
[52] U.S. Cl. ................................ 340/365 P; 250/229
[58] Field of Search ............ 340/365 R, 365 S, 365 E, 340/365 L, 365 P; 250/229; 178/17 C; 179/90 K; 400/472, 479

[56] References Cited

U.S. PATENT DOCUMENTS

| | | | |
|---|---|---|---|
| 3,465,099 | 9/1969 | Harris | 340/365 P |
| 3,579,047 | 5/1971 | Sturm et al. | 340/365 P |
| 3,614,315 | 10/1971 | Glorioso | 178/17 C |
| 3,648,050 | 3/1972 | Koo | 340/365 P |
| 3,668,407 | 6/1972 | Matzen et al. | 340/365 P |
| 3,796,880 | 3/1974 | Dorey | 340/365 P |

*Primary Examiner*—James J. Groody
*Attorney, Agent, or Firm*—David G. Rasmussen; Kevin R. Peterson; Edmund M. Chung

[57] ABSTRACT

The invention relates to a photo-optical keyboard having an improved keyboard housing and keys to provide an N-key rollover feature. The keyboard is comprised of a keyboard housing and keys, and may have a baseplate. The key has a pair of grooves oriented along the axis for both columns and rows to allow the passage of light regardless if the key is in the up position or the depressed position. The keyboard further contains a reset feature to synchronize keyboard logic if it becomes unsynchronized when partial key depressions are made.

16 Claims, 17 Drawing Figures

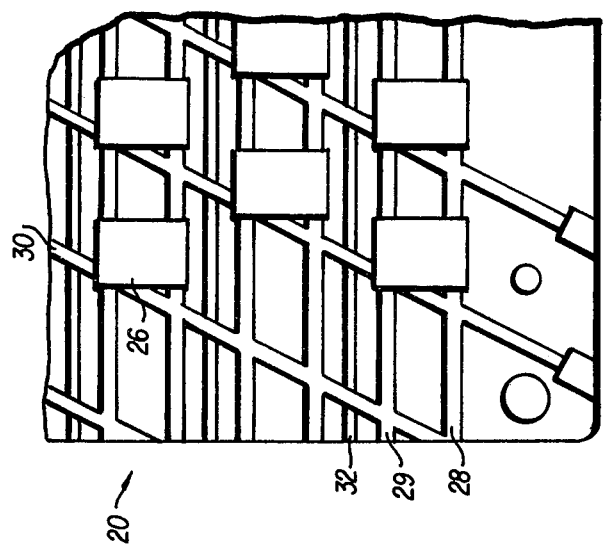
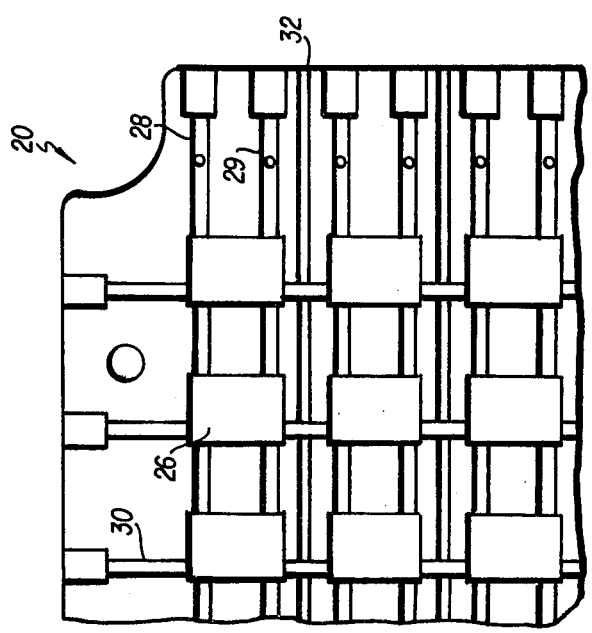
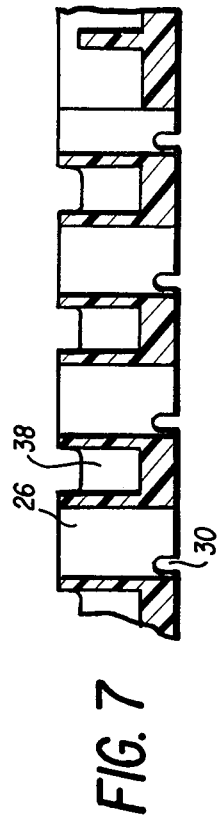
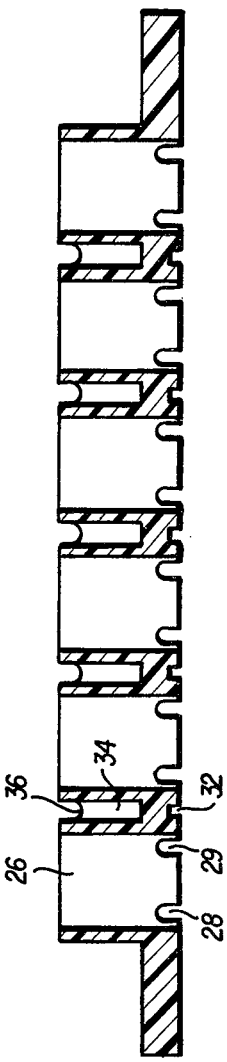

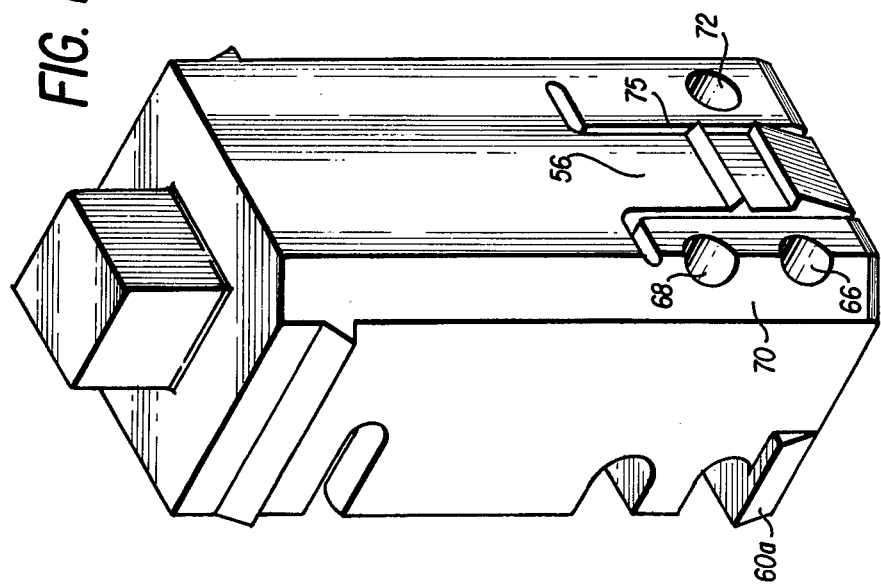
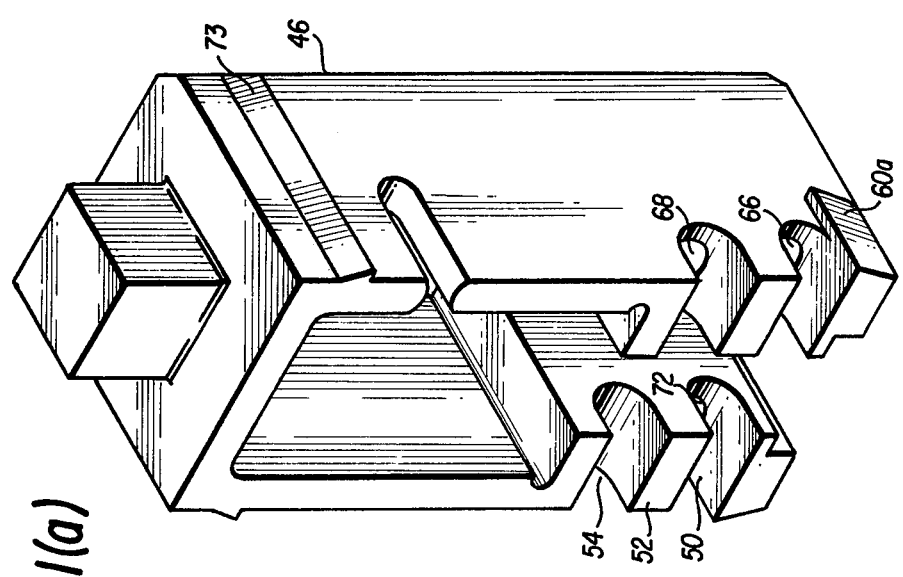

PHOTO-OPTICAL KEYBOARD HAVING N-KEY ROLLOVER

BACKGROUND OF THE INVENTION

1. Field of the Invention

The invention relates to photo-optical keyboards. More specifically, the invention relates to an improved keyboard housing and keys which provide an N-key rollover feature.

2. Description of the Prior Art

One of the problems associated with photo-optical keyboards is the problem of "blind spots". This occurs when an operator has one key depressed and keeps it depressed while depressing a second key. The first key blocks the light channels for a row and a column. If the second key is in one of these two light channels, the depression of the key will not be registered. This problem is resolved by having an N-key rollover feature. This feature allows any number of keys to be depressed within a given time while the output signal will be in the order of key depression regardless if previously depressed keys are released. U.S. Pat. No. 3,796,880 describes one method for incorporating the N-key rollover feature in a photo-optical keyboard. This method involves using decoding circuitry to determine if two keys have been depressed at the same time. The circuitry, however, is complex and expensive.

SUMMARY OF THE INVENTION

The present invention provides a simple cost effective N-key rollover feature for a photo-optical keyboard. The keyboard incorporating the invention includes a keyboard housing and keys, and may contain a baseplate. The keyboard housing has a matrix of rows and columns of apertures for keys. The underside of the housing has a light channel for each row and each column. The light channels are open up to the underside surface of the keyboard housing.

The keys are each shaped to the apertures. Each key has: a set of first passages in its sidewalls which allow light to pass along the column and row light channels in the undepressed position; one or more projections which cause a momentary interruption of light in the row and column light channels when the key is partially depressed; and a second set of passages in the sidewalls for allowing light to again pass along the column and row light channels in the depressed position. This allows a second key depression to be registered even though a first key has been depressed and still held down.

A momentary interruption of the light path normally occurs on the down stroke of the key and again on the release stroke. The electronics expect this second interruption and do not display it as a second depression of the same key.

A reset feature is provided to resynchronize the logic which ignores the return stroke light interruption. This embodiment takes care of the problem of an operator not depressing a key all the way down to allow light to pass through the second passage in the key. This will cause the logic to lose its synchronization. The reset feature will resynchronize the logic. In one embodiment the key has an additional reset passage and the keyboard housing has an additional reset light channel. The additional light channel signal is used to resynchronize the logic. In another embodiment, the logic is reset by using the signal produced by a specific key depression, for example a space bar or a reset key.

A novel feature of the invention is the use of the second set of passages in the sidewalls of the keys to allow light to pass along the rows and columns when the key is depressed. This eliminates the "blind spot" and allows a second key depression to be registered.

A second novel feature is the use of the reset to resynchronize the logic which registers key depressions.

BRIEF DESCRIPTION OF THE DRAWINGS

FIG. 5a is an expanded plan view of a portion of the rectangular matrix of FIG. 4.

FIG. 5b is an expanded plan view of a portion of the diagonal matrix of FIG. 4.

FIG. 7 is a partial sectional view taken along A—A of FIG. 3.

FIG. 8 is a partial sectional view taken along B—B of FIG. 3.

FIGS. 11(a), 11(b) are perspective views of the key of FIG. 10.

DETAILED DESCRIPTION OF THE PREFERRED EMBODIMENTS

Figure 1:
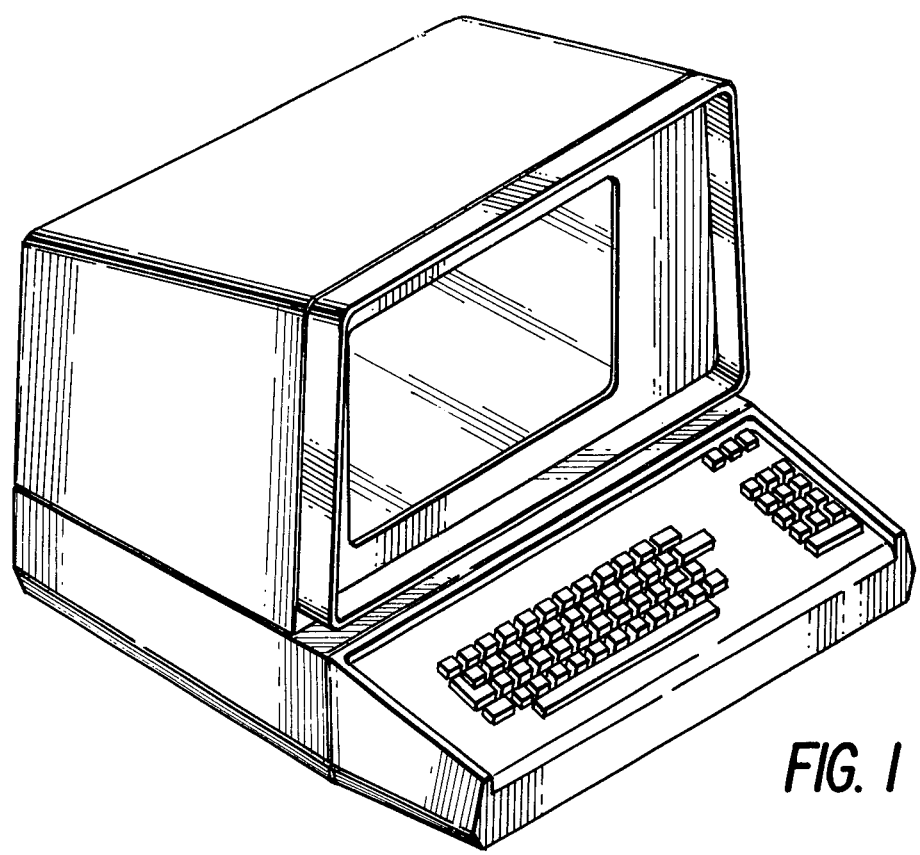
FIG. 1 is a perspective view of a CRT display terminal having a photo-optical keyboard.

FIG. 1 shows a typical operator terminal for a computer, word processor, or like type system. The terminal may, for example, have the characteristics of a typewriter and a calculator. The keys may be in a rectangular matrix as the calculator keys or in a diagonal matrix as the typewriter keys. All of the keys are located on one keyboard which has an excess capacity of key locations and is easily expandable. To add other keys to the keyboard, the only change that need be made is the insertion of the additional keys and changing of the faceplate.

Figure 2:
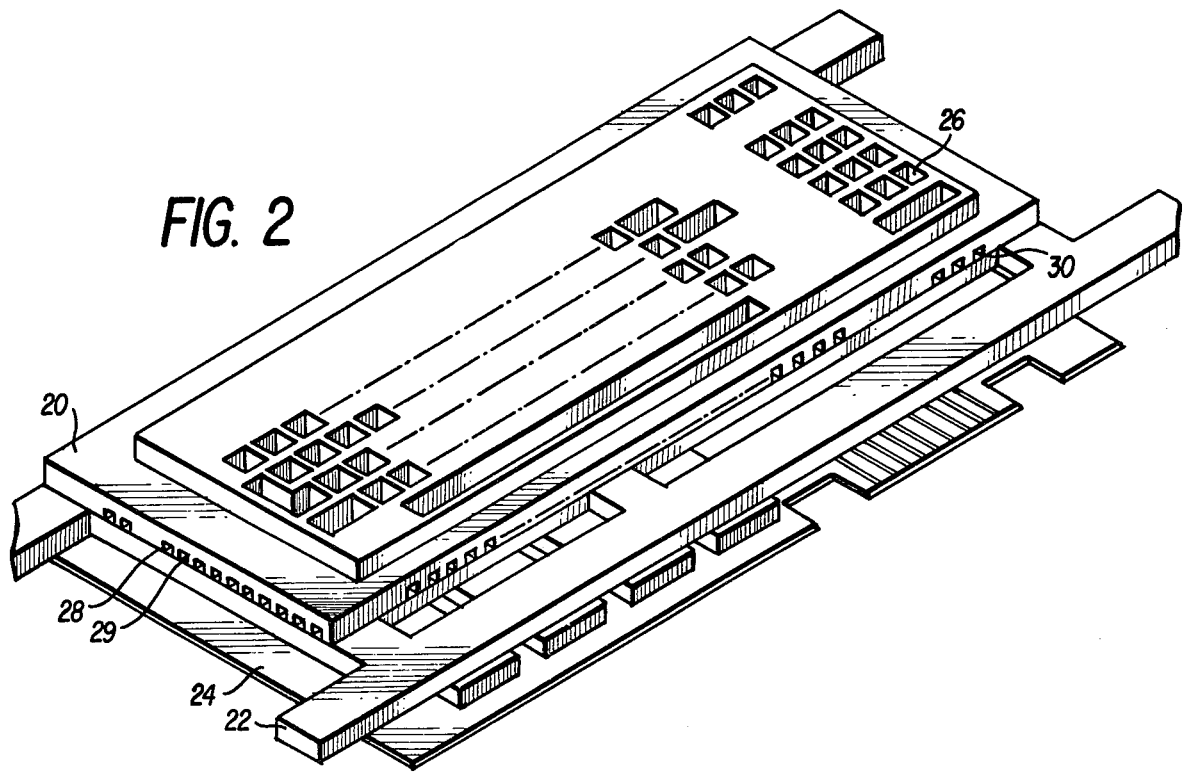
FIG. 2 is a perspective view of the photo-optical keyboard assembly having keys, faceplate, and CRT removed.

FIG. 2 shows the keyboard of FIG. 1 with the faceplate and keys removed. The keyboard consists of a keyboard housing 20, a baseplate 22 and a printed circuit board 24. Printed circuit board 24 is attached to baseplate 22 by appropriate fasteners (not shown). Keyboard housing 20 has rectangular apertures 26 into which keystems will fit. Only a few apertures are shown for illustration purposes, however, normally the whole raised portion of the keyboard housing will be taken up with apertures. At the base of the keyboard are shown optical passages or light channels. Light channels 28 and reset light channels 29 extend along the long axis and light channels 30 extend along the short axis. Light channels 28, 30 and reset light channel 29 are entirely in the keyboard housing 20. Light channels 28 and reset light channels 29 extend between all of the key apertures in each row. Light channels 30 extend between all of the apertures in each column. An illumination source such as a light, light emitting diode or fiber optic bundle is placed at one end of light channels 28, 30 and reset light channels 29 and photoreceptors are placed at the other end. These are not shown.

Depressing a key obstructs the light path along both a row and column. The photosensor at the end of the row or column senses the obstruction and generates an electronic signal. Decoding electronics determine the unique key located at the intersection of the obstructed row and column. The electronics then put out an appropriate signal. Printed circuit board 24 contains all of the decoding and electronic circuitry necessary for the keyboard. This all may be done with conventional circuitry.

Figure 3:
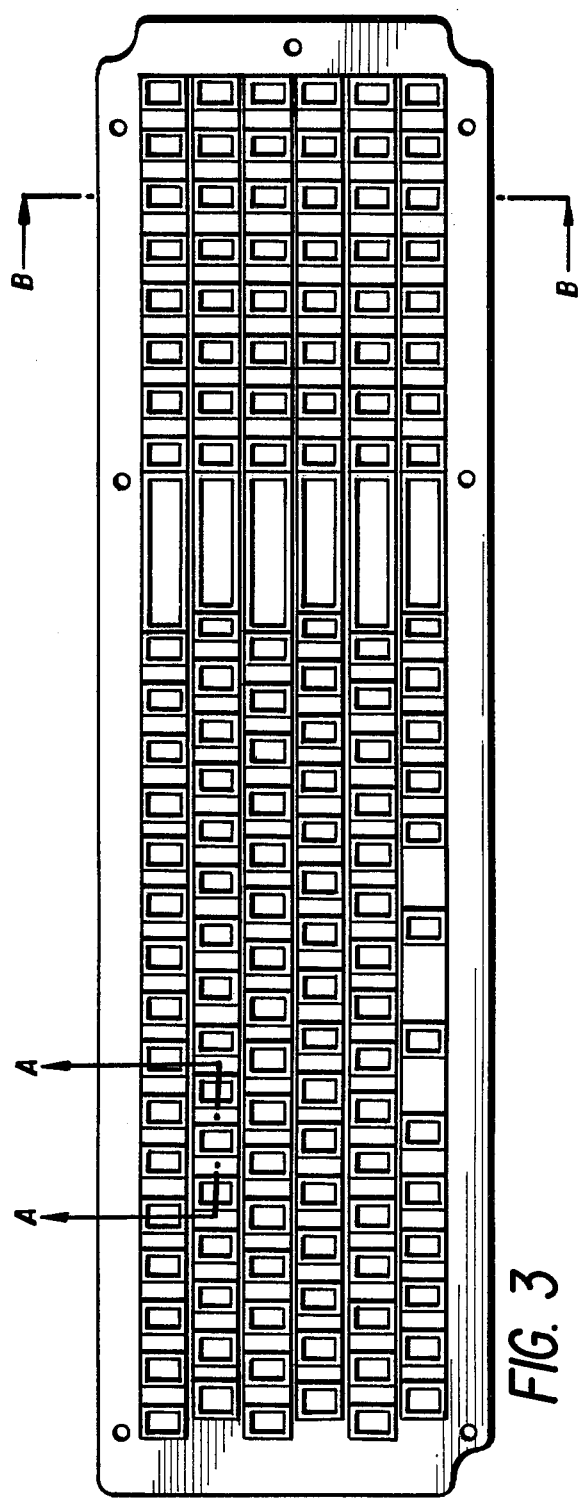
FIG. 3 is a plan view of a keyboard housing having key apertures in a rectangular matrix and a diagonal matrix.

FIG. 3 shows a more detailed top view of the key arrangement on the keyboard housing 20 of FIG. 2. The leftmost group of keys are in a diagonal (offset) matrix typical of a typewriter keyboard. The group of keys on the right are in a rectangular matrix typical of calculator keys.

Figure 4:
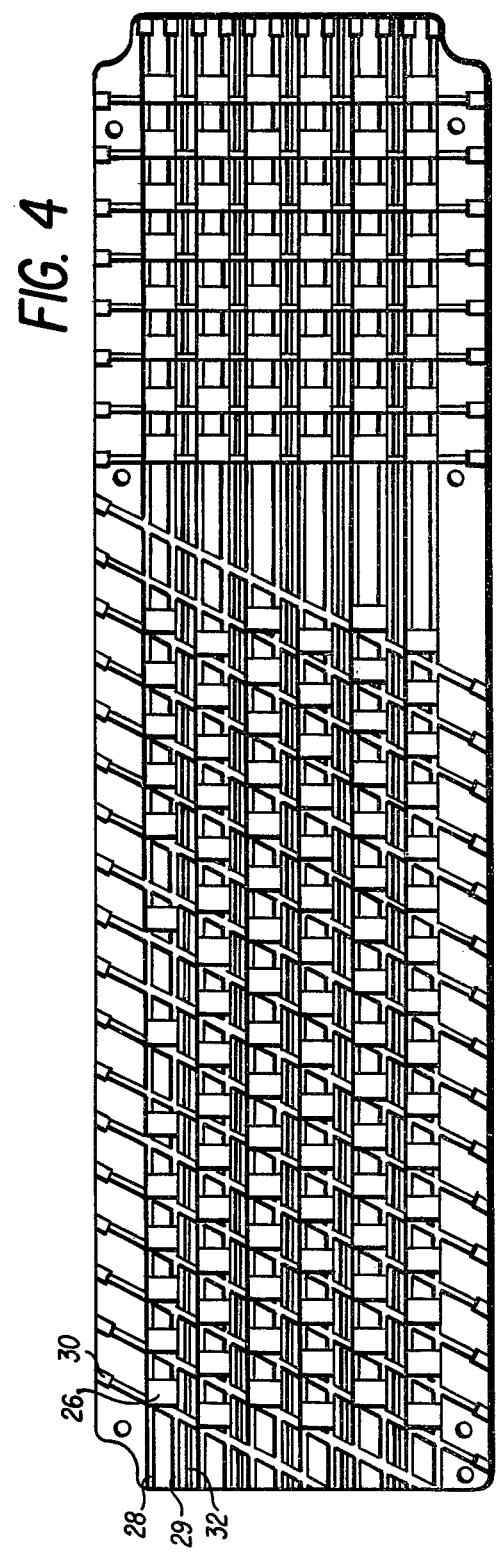
FIG. 4 is a bottom view of the keyboard housing of FIG. 3 showing light channels for both the diagonal matrix and the rectangular matrix.

FIG. 4 shows a bottom view of the keyboard housing of FIG. 3. The bottoms of apertures 26 in both the diagonal and rectangular matrixes have light channels 28, 30 for the rows and columns respectively and light channel 29 for the reset light channels. Between each of the rows are light isolation barrier channels 32. All of the channels are molded into the bottom of keyboard housing 20.

FIG. 5a shows an expanded partial bottom view of the rectangular matrix of FIG. 4. Keyboard housing 20 has apertures 26, column light channels 30, row light channels 28, reset light channels 29. The rows of light channels have light isolation barrier channels 32 between them. The reset light channels are needed along only one axis and could be placed in either the rows or columns. However, fewer light sources are required if they are placed in the rows.

Light channels 28, 30 and reset light channels 29 are set in about 1/32 of an inch from the edges of apertures 26. The light channels and reset channels are set in to prevent light leakage along the sides of a key when the key is depressed. If the light channels were placed exactly along the edges of the key apertures, a key would allow light between the surface of the key and the surface of the key aperture. As the key became worn the problem would be further aggravated. By setting the light channels in about 1/32 of an inch the key will completely overlap the light channel and prevent leakage.

FIG. 5b shows an expanded partial bottom view of the diagonal matrix of FIG. 4. The diagonal matrix has the same light channels 28, 30, reset light channel 29, apertures 26, and light isolation barrier channel 32 as FIG. 5.

Figure 6:
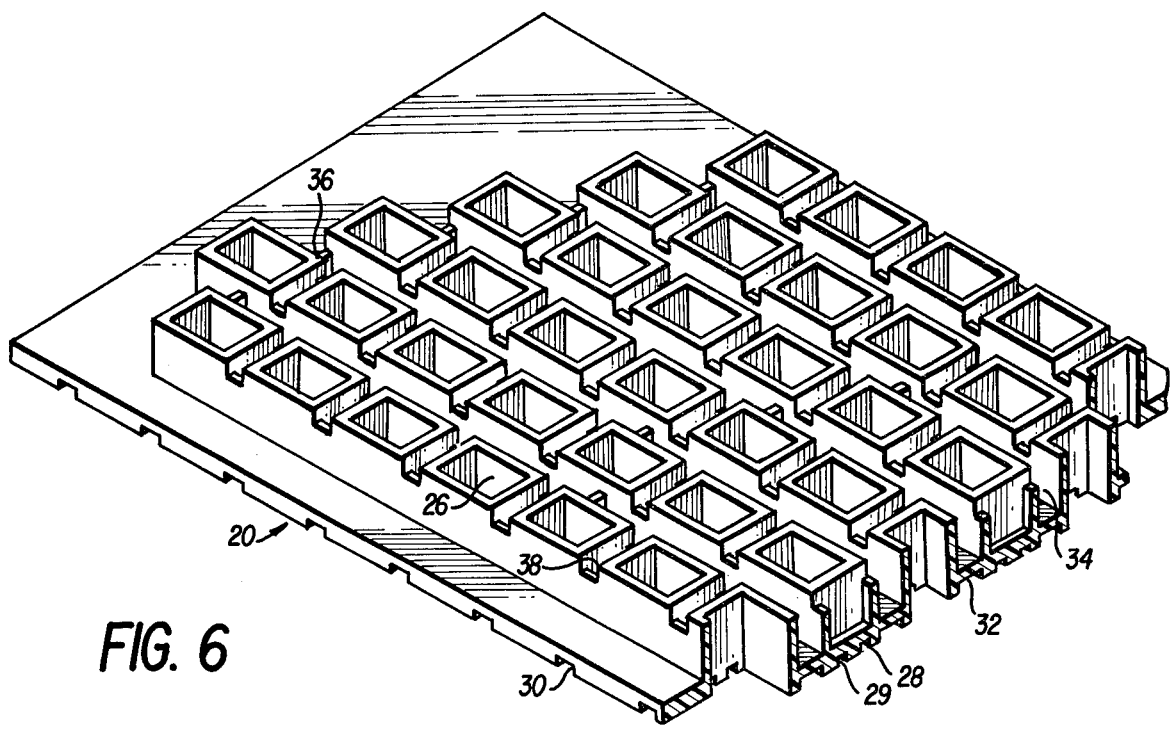
FIG. 6 is a perspective partial sectional view of the diagonal matrix portion of the keyboard housing of FIG. 3.

FIG. 6 shows a sectional view of keyboard housing 20. Light channels 28, 30 and reset light channel 29 are at the bottom of the keyboard housing. These channels may be of the order of 3/32 inch in depth. Likewise light isolation barrier channels 32 are at the bottom of the keyboard housing. Between rows of apertures 26 are recesses 34 and structural members 36. The structural members are below the top surface of the keyboard housing. Between columns of apertures 26 are recesses 38. The sidewalls of of recesses 38 are lower than the sidewalls of apertures 26. Recesses 34 and 38 are to catch debris and accidental liquid spills on the keyboard.

FIG. 7 is partial sectional view taken along A—A of FIG. 3. The figure shows a cross section of several columns of the diagonal matrix. Column light channels 30 are shown set in from the edge of apertures 26. Recesses 38 are shown between apertures 26.

FIG. 8 is a partial sectional view taken along B—B of FIG. 3. The figure shows a cross section of several rows. Recesses 34 with structural supports 36 are shown between apertures 26. Row light channel 28 and reset light channel 29 are shown set in from the edges of apertures 26. Light isolation barrier channels 32 are between the rows.

Figure 9:
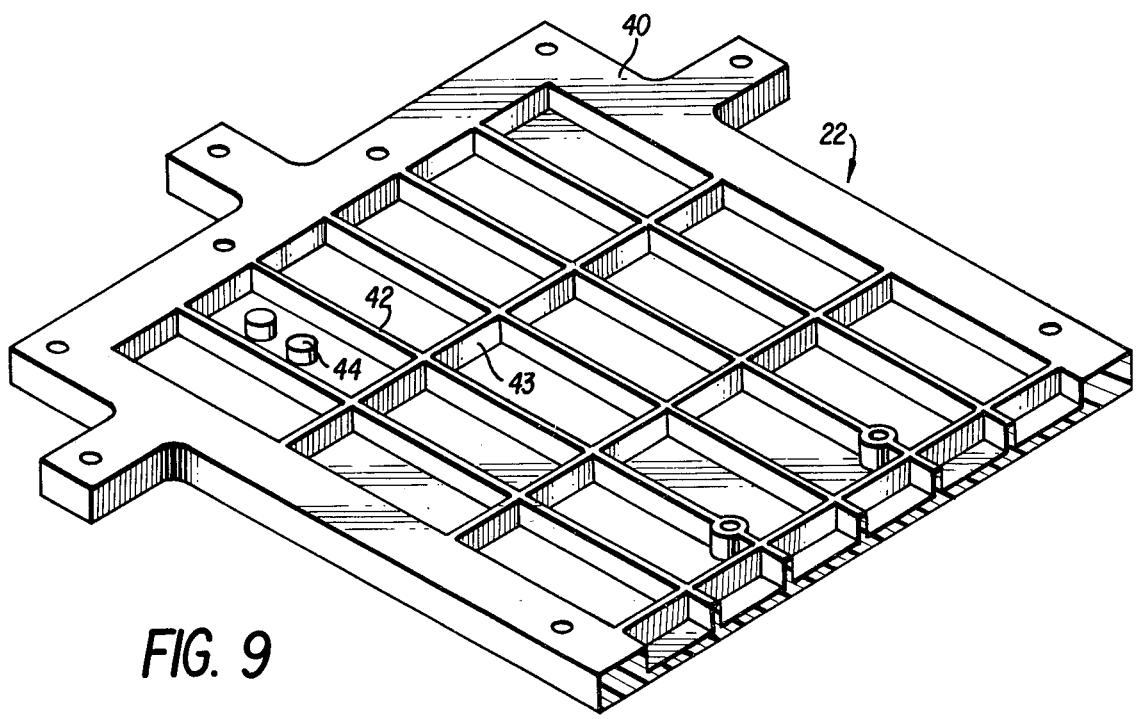
FIG. 9 is a perspective partial sectional view of the baseplate of the keyboard assembly of FIG. 2.

FIG. 9 shows base plate 22 of the keyboard. The outer edge 40 will fit flush to the bottom of keyboard housing 20. The inner portion of baseplate 22 is recessed with light isolation barriers 42 (i.e. ribs) running in the direction of the rows. Structural supports 43 run in the direction of the columns. The light isolation barriers 42 are intended to fit up into light isolation channels 32 (shown in FIG. 5a). The light isolation barriers are required to prevent the divergent light from one row from impinging on a photoreceptor for another row. The rows are long, of the order of 20 inches, and light divergence is large, therefore, the light isolation barriers are needed. On the other hand, the columns are short, of the order of 4 inches, and divergence is smaller so the barriers are not needed. The ribs have been added between every two or three columns only for strength. Projections 44 are spring retainers which are placed at a location below each aperture 26 of the keyboard (only two are shown). The structure of baseplate 22 may be molded from plastic in a one-piece molding operation.

The light isolation barriers are considered the preferred embodiment, however, other embodiments of the baseplate could be used. For example, the light isolation channels 32 in the keyboard housing could be eliminated and the light isolation barriers extend only up to the keyboard housing, but warpage would generate spaces between the light isolation barriers and the bottom surface of the keyboard housing. This would result in leakage of light. Another example would be a solid baseplate 22 with recesses below each aperture. This would allow overtravel of keys but would allow leakage of light because of warpage in the bottom plate and keyboard housing.

Figure 10B:
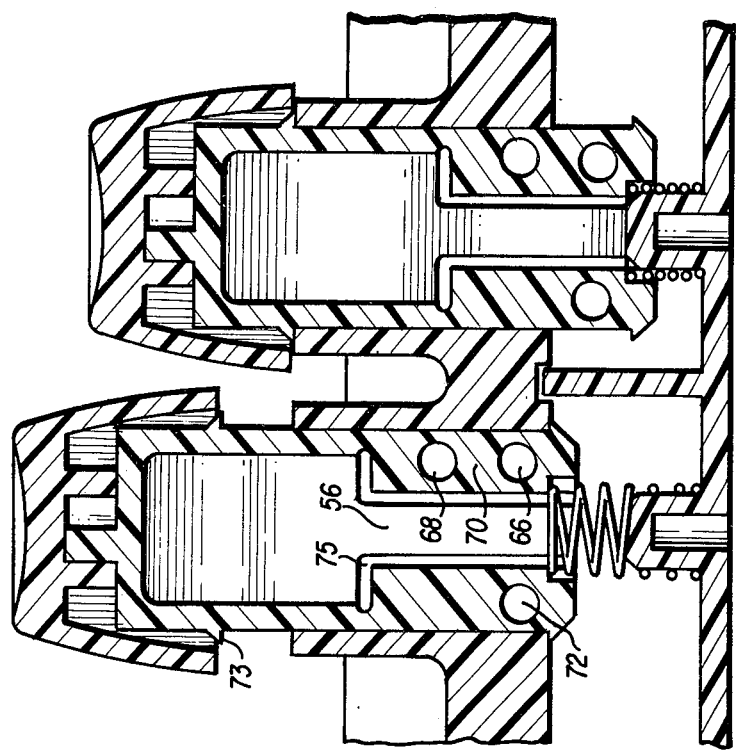
FIG. 10b is a sectional view of the same key as FIG. 10a with the section orientation along the rows.
Figure 10A:
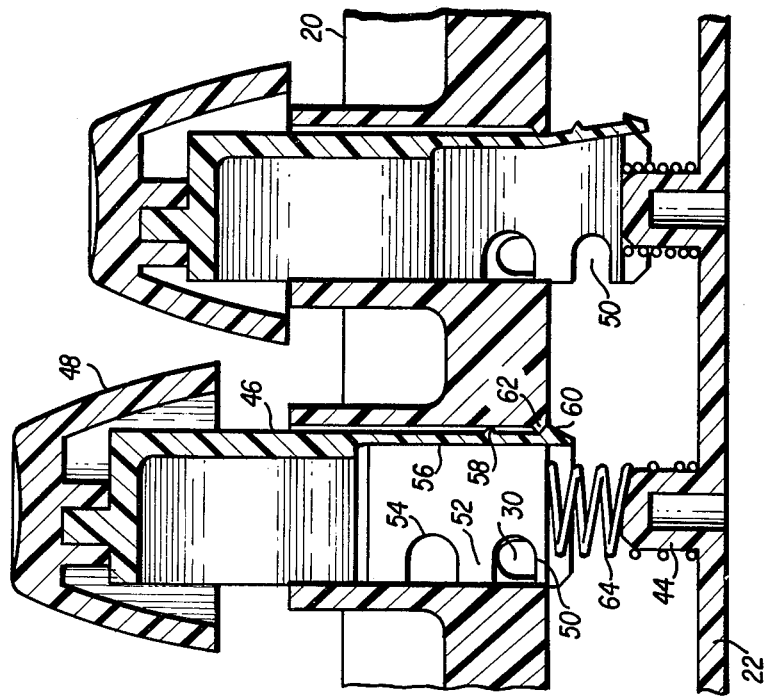
FIG. 10a is a sectional view of the keys for the keyboard housing of FIG. 3. The section is oriented along the columns.

FIG. 10a shows a front view of a key adapted to have the N-key rollover feature. The key is in keyboard housing 20. The key is made up of a keystem 46 and an umbrella shaped keytop 48. The keytop is molded from ABS plastic while the single piece keystem 46 is molded of a high wear-low friction plastic such as acetel. The two parts are joined together at assembly. There are two passages at the outer surface of the sidewall of keystem 46 which will serve to pass light from column light channels 30. These latter light channels come out of the page. When the key is in the up position light will pass through passage 50. When the key is depressed light will be interrupted momentarily by projection 52 and then will be allowed to pass through passage 54. Keystem 46 has a flexible finger 56 with a ridge 58 and a flange 60 thereon. The keyboard housing 20 has a ridge 62 on the inner surface of each key aperture. The flexible finger allows ridges 58, 62 to pass after contact is made. As a key is depressed, the return spring provides a resistive force. As the projection 58 on the stem meets with the projection 62 in the aperture, additional force is required to depress the stem. As the projections pass the force drops off sharply, producing a tactile feel. The pressure needed for the tactile feel may be predetermined by changing the slopes of ridges 58, 62. At the end of flexible finger 56 is flange 60 which serves as a stop to prevent the key from coming out of aperture 26. The flexibility of finger 56 allows the keys to be withdrawn easily for replacement. When the key is withdrawn the pressure will cause the fingers to flex inward and allow the key to come out.

Spring retainer 44 is a raised projection from baseplate 22. The spring retainer prevents buckling of spring 64, and facilitates initial assembly and subsequent replacement.

FIG. 10b shows a side view of the key shown in FIG. 10a. Passage 66 allows light from row light channels 28 (coming out of the page directly in line with passage 66) to pass when the key is in the up position. When the key is depressed light will be interrupted momentarily by projection 70 and then will be allowed to pass through opening 68. A third passage 72 acts as a reset passage. Light in reset channel 29 will normally pass through reset passage 72 with which it is in line and coextensive when the key is not depressed. When the key is depressed the light is interrupted. When a key depression is complete and the key returns to the undepressed position the returning light through passage 72 resets the logic elements.

Stops 73 prevent the keystem 46 from being depressed all the way to the bottom of baseplate 22. This eliminates a potential problem caused by a buildup of dust and debris at the bottom of baseplate 22. If the key were to be depressed all the way to the bottom, the key would be stopped by the debris and projections 52, 70 would not interrupt the light beam completely.

Light isolation barrier 42 extends up into light isolation channel 32 to prevent divergent light from one light channel to impinge upon the photoreceptor of another channel.

Flanges 60a are similar to flange 60 and serve the same purpose. Flanges 60a require that the sidewalls of keystem 46 be flexible. The sidewalls are flexible because of the presence of flexible finger 56 in the back wall. Flexible finger 56 is formed by a cut 75 in the back wall and separates it from the sidewall, allowing flexibility of the fingers and sidewall. This is more clearly seen in FIG. 11b.

FIGS. 11a and 11b show a perspective and back view of the keystem 46 of FIG. 10. Corresponding numbers indicate the corresponding elements of FIGS. 10 and 11.

In the prior art the N-key rollover problem occurs when an operator typing with two hands has one key depressed and keeps it depressed while depressing a second key. The first key has blocked row and column light channels and if the second key is in one of these channels the second key depression will not be registered. This problem is taken care of by the N-key rollover feature of the present invention. When the first key is depressed there will be a momentary interruption in the light channels by projections 52, 70 which will register as a depression. Then light will be allowed to pass again through grooves 54, 68 as the key is depressed all the way. A second key depression then may be made and registered. As the first key is released, it causes another interruption as it comes back into the up position. However, the decoding logic expects this second interruption and disregards it.

A problem occurs if an operator does not depress the key all the way. An interruption in the row and column light channels will occur but the key may not be depressed far enough to allow light to pass again through grooves 54, 68. If the key is allowed to come back into the up position the decoding logic would still be waiting for the light from groove 54, 68 to appear. The decoding logic would otherwise mistake a repeat key depression as the return light obstruction of the original key. At this point the logic is not synchronized for properly recognizing key depressions. This problem is resolved by the reset feature using reset light channel 29 and reset passage 72. The returning keystem, in the up position, removes the obstruction from the reset channel. When the key is released a reset signal is sent to the logic to reset and synchronize it. The keyboard is thus always synchronized when all keys are in the up position. If the logic is unsynchronized and several keys within the row are depressed concurrently, the depressed keys will interrupt light in the reset light channels until the last of the keys are released. The reset and synchronization will not occur until the last key in each row is released. The reset light channel is needed along only one axis to reset the decoding logic.

When synchronization is lost the letter is recognized on the release stroke of a key rather than the down stroke. If a very fast typist is using this keyboard, on loss of synchronization the second key can be registered before the first key is released thus the letters can appear in the reverse sequence.

Another means of achieving the resynchronization feature would use a frequently depressed key such as the space bar to reset the logic at the end of each word. This method eliminates the need for the extra lights and receivers for the reset path together with their associated circuitry.

Since each word is separately synchronized and loss of synchronization should be relatively uncommon, this method of reset may be considered to have only minor drawbacks when balanced against the simplicity and cost reductions obtained when compared to the previously described method.

Figure 12:
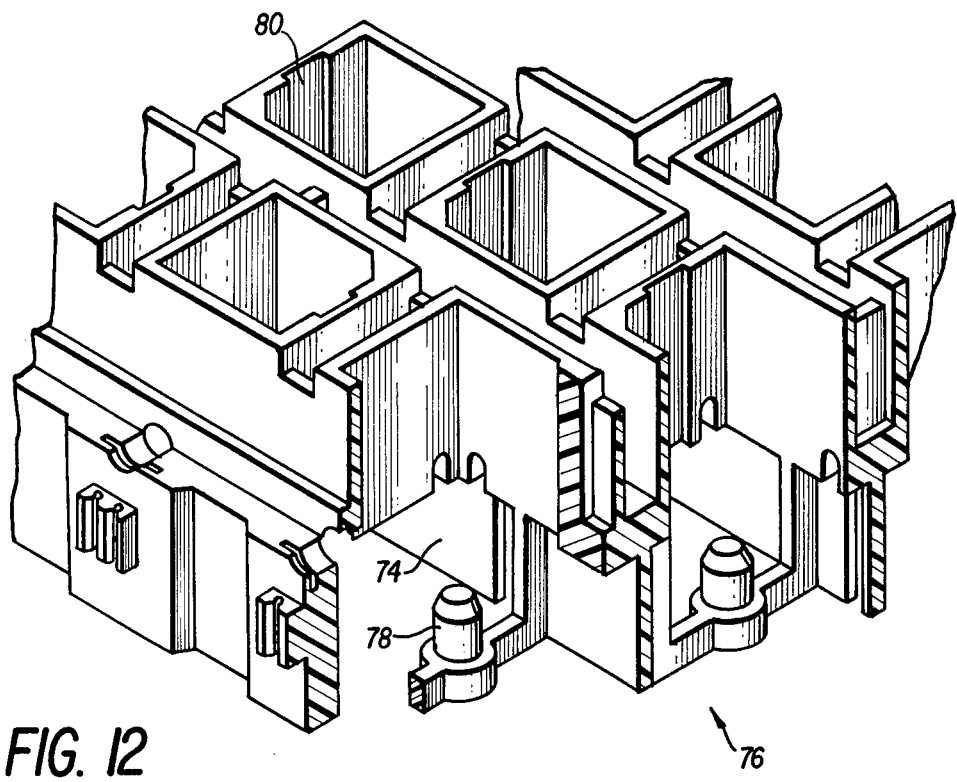
FIG. 12 is a perspective partial sectional view of an alternative keyboard housing.

An alternative embodiment to the apparatus shown in FIGS. 1-11 is shown in FIG. 12. This embodiment is simpler in structure and is preferred under some circumstances. In this embodiment light isolation barriers 74 extend downward from keyboard housing 76. This is in contrast to the previous embodiment where the light isolation barriers 42 extend up from the baseplate (shown in FIG. 9). By molding the light isolation barriers 74 as an integral part of the keyboard housing 76 the need for a baseplate is eliminated. The spring retainers 44 of baseplate 22 are replaced by spring retainers 78 which are supported between the light isolation barriers 74. Channels 80 for the inclusion of tactile ridges have been added. A tactile ridge is in each channel near the bottoms of the key apertures.

Figure 13:
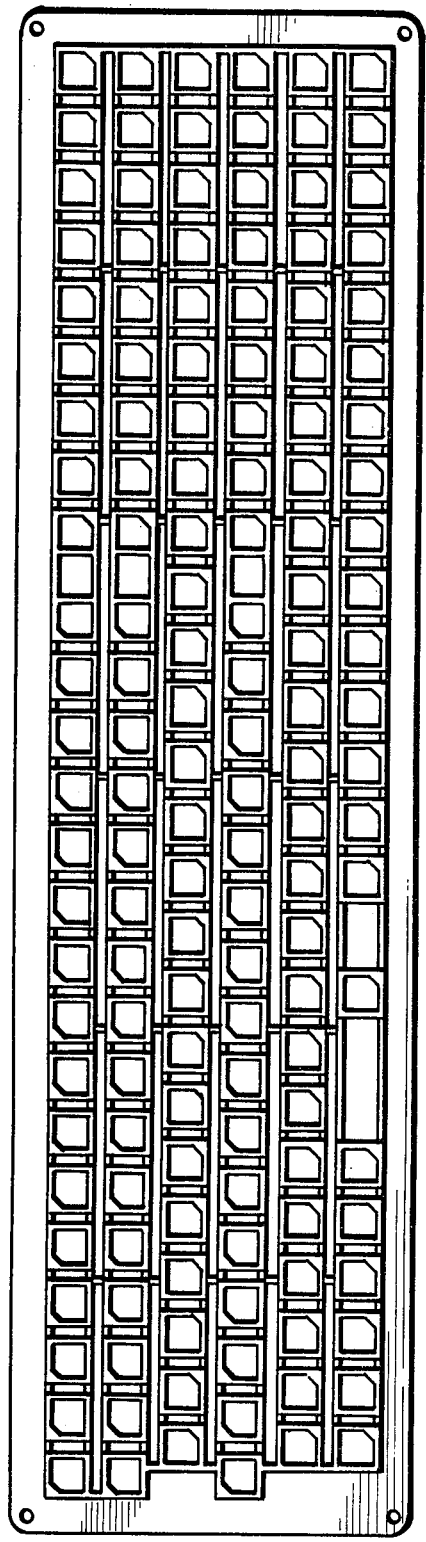
FIG. 13 is a plan view of an alternative layout of key apertures and light channels in a keyboard housing.
Figure 14:
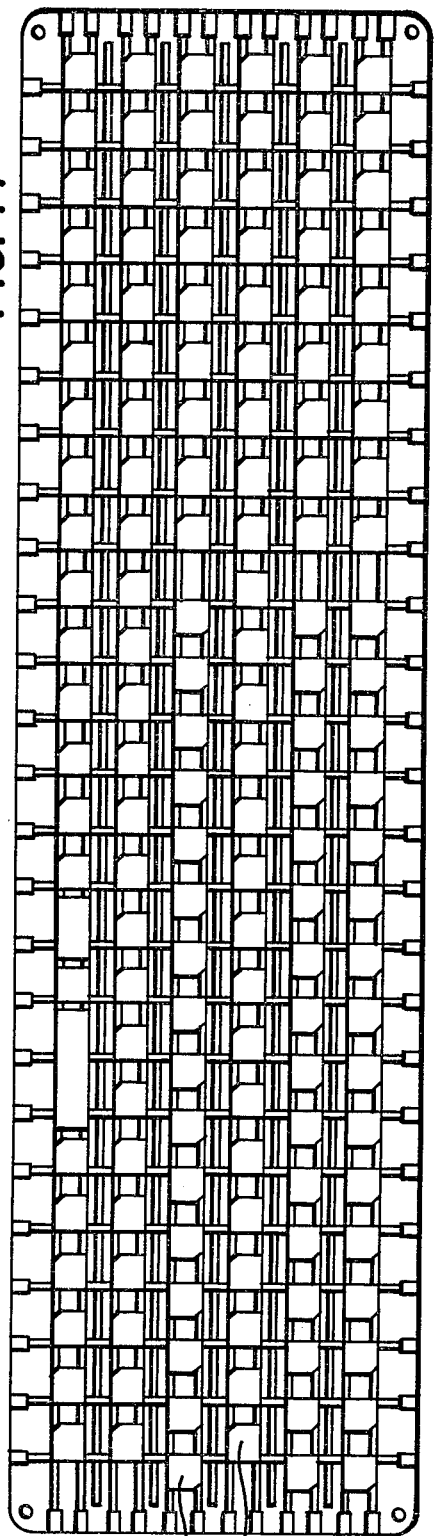
FIG. 14 is a bottom view of the keyboard housing of FIG. 13.

A third alternative embodiment of the invention is shown in FIGS. 13 and 14. This embodiment shows an alternative way of arranging the light channels and key apertures that are shown in FIGS. 3 and 4. In FIGS. 13 and 14 the light channels are all in a rectangular matrix. A staggered arrangement for keys may be accomplished by placng the key apertures on alternate sides of a light channel as is shown by key apertures 82, 84 of FIG. 14. This simplifies the design of the molds needed to produce the keyboard housing. Furthermore, the same keys can be used in either key aperture 82 or 84. The keystem need only be turned 180° to fit one or the other. A chamfer on one corner of the aperture which matches a similar chamfer on the keystem assures proper orientation of the keystem. The structure of the keyboard shown in FIG. 12 may be used for the keyboard layout of FIGS. 13, 14.

One novel feature of the invention lies in the use of a pair of passages or grooves in the sidewalls of the key for allowing light to pass along both the rows and columns when the key is both up and depressed. The unobstructed light path when a key is depressed allows a second key depression to be "seen" and registered. Furthermore the grooves and passages are formed in the sidewall of the key allowing for molding of the stem in one molding operation.

The second novel feature is the use of the reset to resynchronize the logic. The reset feature may either be the embodiment incorporating the reset groove and reset channel or the embodiment using the signal from a frequently depressed key to reset. A third embodiment would be adding an additional key which the operator would activate if the keyboard went out of synchronization.

What is claimed is:

1. A photo-optical keyboard with N-key rollover comprising:
   a keyboard housing having a matrix of rows and columns of apertures for keys, a light channel for each row passing between the apertures of each row; and a light channel for each column passing between the apertures of each column; and
   multiple keys each shaped to said apertures, each said key having first passages for allowing light to pass through said column and row light channels in the undepressed position, one or more projections causing an interruption of light in said row and light channels in the partially depressed position, second passages for allowing light to pass through said column and row light channels in the substantially depressed position.

2. The apparatus of claim 1 in which said light channels open up to the bottom of said keyboard housing.

3. The apparatus of claim 2 further comprising light isolation barriers positioned between said light channels and extending downward from the underside of said keyboard housing to prevent crossover of light between said light channels.

4. The apparatus of claim 3 in which said light isolation barriers are between said rows.

5. The apparatus of claim 3 in which said light isolation barriers are integral with said keyboard housing.

6. The apparatus of claim 3 further comprising a baseplate adjacent to and spaced from the underside of said keyboard housing, said baseplate having light isolation barriers protruding, said keyboard housing having light isolation barrier channels opening up to the underside surface of said keyboard housing into which said light isolation barriers extend.

7. The apparatus of claim 1 in which said first and second passages of said keys are passages in the sidewalls of said keys.

8. The apparatus of claim 7 in which said second passages are above said first passages.

9. The apparatus of claim 8 in which said light channels open up to the bottom of said keyboard housing.

10. The apparatus of claim 9 further comprising light isolation barriers positioned between said rows of light channels and extending downwardly from the underside of said keyboard housing to prevent crossover of light between said light channels.

11. A photo-optical keyboard including logic for registering key depressions, the keyboard having N-key rollover comprising:
    a keyboard housing having a matrix of rows and columns of apertures for keys, a light channel for each row passing between the apertures of each row, and a light channel for each column passing between the apertures of each column;
    multiple keys each shaped to said apertures, each said key having first passages for allowing light to pass through said column and row light channels in the undepressed position, one or more projections causing an interruption of light in said row and light channels in the partially depressed position, second passages for allowing light to pass through said column and row light channels in the substantially depressed position; and
    reset means for resetting said logic when said logic becomes unsynchronized because of partial key depressions.

12. The apparatus of claim 11 in which said reset means includes reset light channels in said keyboard housing passing between said key apertures, and a reset passage in each said key which passes light and resets the logic in said reset light channel when said key is in the undepressed position and blocks light in the depressed position.

13. The apparatus of claim 11 in which said reset means is the signal from one of said multiple keys which is used to initiate the resetting of said logic.

14. The apparatus of claim 11 in which said first and second passages of said keys are grooves or apertures in the sidewalls of said keys.

15. The apparatus of claim 14 in which said light channels open up to the bottom of said keyboard housing.

16. The apparatus of claim 15 further comprising light isolation barriers between said light channels and extending downward from the underside of said keyboard housing to prevent crossover of light between said light channels.

* * * * *